United States Patent [19]

Eisenhart

[11] Patent Number: 5,369,367
[45] Date of Patent: Nov. 29, 1994

[54] WIDEBAND COAX-TO-$TM_{01}$ CONVERTER AND TESTING SYSTEM USING THE SAME

[75] Inventor: Robert L. Eisenhart, Woodland Hills, Calif.

[73] Assignee: Hughes Aircraft Company, Los Angeles, Calif.

[21] Appl. No.: 984,398

[22] Filed: Dec. 2, 1992

[51] Int. Cl.$^5$ .................. G01R 27/04; H01P 5/103
[52] U.S. Cl. .................. 324/632; 324/642; 333/26; 333/34
[58] Field of Search ............ 333/21 R, 34, 26; 324/642, 632

[56] References Cited

U.S. PATENT DOCUMENTS

| | | | |
|---|---|---|---|
| 2,652,475 | 9/1953 | Spencer | 333/34 X |
| 3,176,250 | 3/1965 | Marchand et al. | 333/34 |
| 4,280,112 | 7/1981 | Eisenhart | 333/21 R |
| 4,853,656 | 8/1989 | Guillou et al. | 333/34 |

OTHER PUBLICATIONS

De Vore, Coaxial Line Impedance Transformer, Ser. No. 475,947, filed Feb. 15, 1943, published Oct. 18, 1949, vol. 627, p. 873, O.G.

"Input Impedance of a Coaxial Line Probe Feeding a Circular Waveguide in the $TM_{01}$ Mode," R. H. Mac-Phie et al., IEEE Transactions on Microwave theory and Techniques, vol. 38, No. 3, Mar. 1990, pp. 334–337.

Primary Examiner—Paul Gensler
Attorney, Agent, or Firm—Charles D. Brown; Randall M. Heald; Wanda K. Denson-Low

[57] ABSTRACT

A wideband convertor for mode conversion between a TEM coaxial mode in coaxial line and the $TM_{01}$ circular waveguide mode in circular waveguide. The convertor takes advantage of the somewhat similar electric field configurations of the two modes. To physically match the coaxial line to the waveguide, a tapered section is employed to provide a gradual diameter transition.

25 Claims, 4 Drawing Sheets

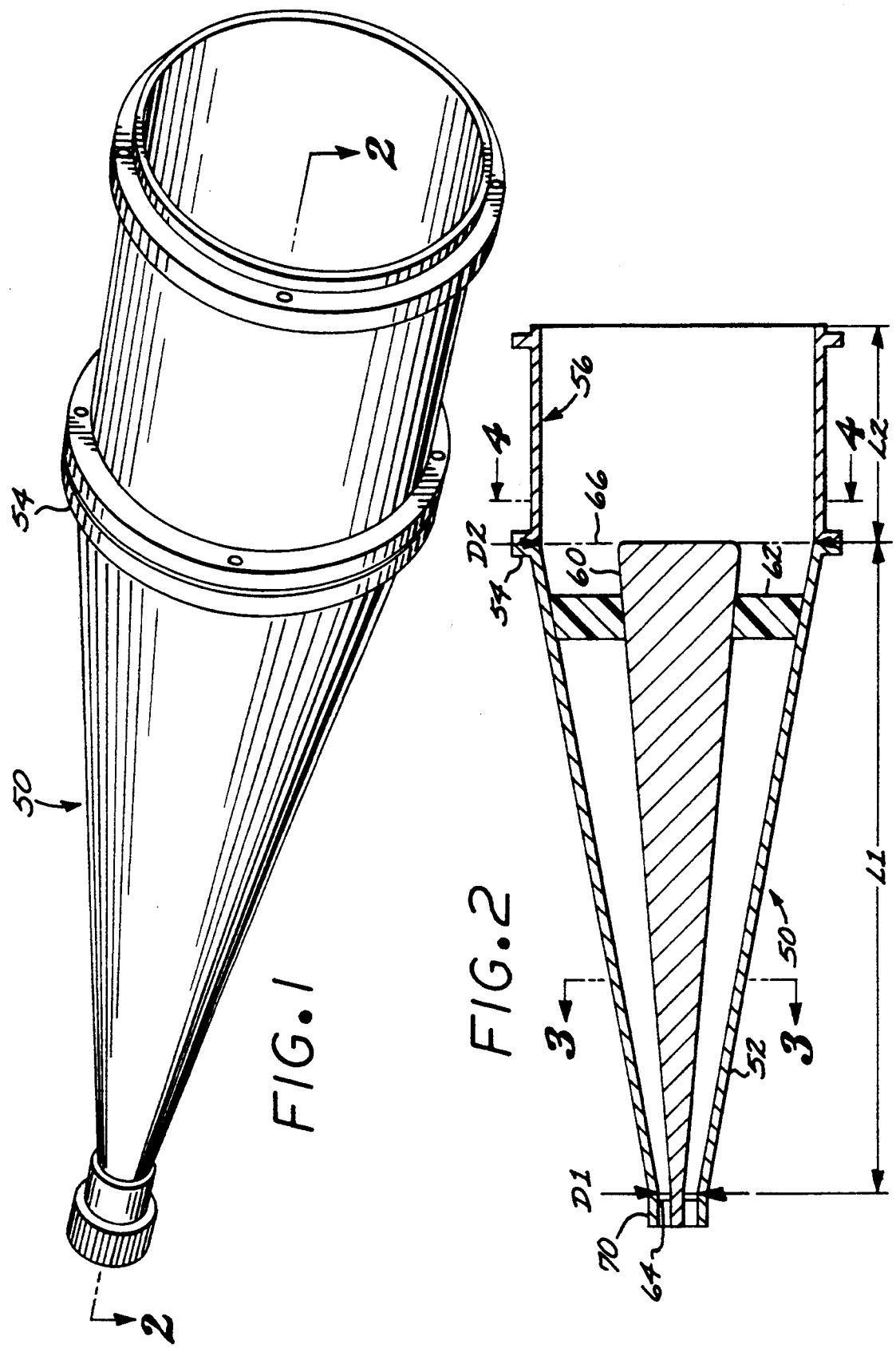

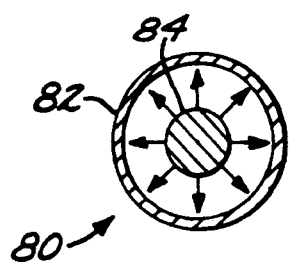
FIG.3
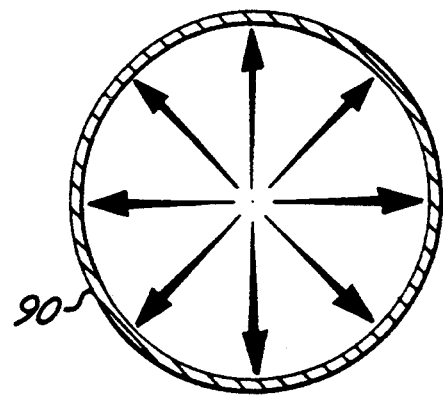
FIG.4
FIG.5A
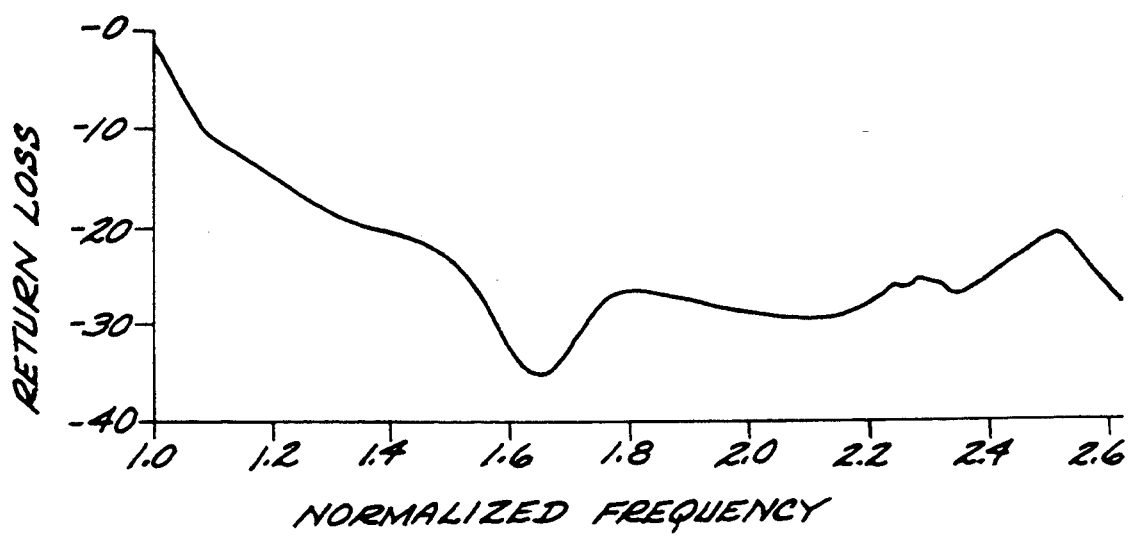

ically cylindrical outer conductor of the coaxial line to the diameter of the circular waveguide at the circular waveguide end.

WIDEBAND COAX-TO-TM$_{01}$ CONVERTER AND TESTING SYSTEM USING THE SAME

BACKGROUND OF THE INVENTION

The present invention relates to waveguide-to-coaxial line transition apparatus, and more particularly to a convertor apparatus for converting to or from a TM$_{01}$ waveguide mode in circular waveguide from or to a coaxial transmission line, respectively.

The TM$_{01}$ mode has unique characteristics which are often utilized in circular waveguide components. To measure such components it is necessary to be able to sense and/or generate the TM$_{01}$ mode. However, the coaxial configuration is the commonly used mode on most test equipment, and a mode convertor to the TM$_{01}$ mode is required. Mode conversion is also sometimes desired within a component, and this approach is directly applicable.

There are two known approaches for conversion between coaxial line and the TM$_{01}$ circular waveguide mode. The first involves inserting the center conductor of a coax line into the endplate of a circular waveguide, thus acting as an excitation probe. "Input Impedance of a Coaxial Line Probe Feeding a Circular Waveguide in the TM$_{01}$ Mode," R. H. MacPhie et al., IEEE Tran. Microwave Theory Tech., Vol. MTT-38, pp 334–337, March 1990. The probe is concentric and aligned with the waveguide axis. While this configuration is simple, it is narrow band and requires tuning of the probe length to get a match. Moreover, the operating bandwidth is limited to approximately 10% by the excitation of the higher order "TM$_{01}$-coax" mode.

The second approach first adapts the coaxial line to rectangular waveguide, splits the rectangular waveguide into two arms, and then couples to the circular waveguide with two symmetrically mounted, in-phase apertures. This configuration is large relative to the circular waveguide, is not well matched and has an instantaneous bandwidth of only about 10%, being limited on the upper end by excitation of the circular TE$_{21}$ mode.

It is therefore an object of this invention to provide a well-matched, wideband device for mode conversion between the coaxial (TEM) and the TM$_{01}$ circular waveguide modes.

A further object is to provide a mode convertor for conversion between the coaxial mode and circular waveguide mode which maintains mode purity over the entire TM$_{01}$ band, up to the frequency at which the TM$_{02}$ mode begins.

Yet another object is to provide a device for conversion between the coaxial mode and circular waveguide mode which is relatively small and simple to fabricate.

Yet another object is to provide a device for conversion between the coaxial mode and circular waveguide mode which allows for maximum power transfer between the modes.

SUMMARY OF THE INVENTION

In accordance with the invention, a wideband coaxial-to-circular waveguide convertor is provided, which may be fitted between a coaxial transmission line and a circular waveguide. The convertor is characterized by a coaxial end and a waveguide end, and comprises a tapered hollow conductor, the diameter of which transitions from a diameter equal to the diameter of the outer conductor of the coaxial line to the diameter of the circular waveguide at the circular waveguide end.

The convertor further comprises a tapered inner conductor concentrically mounted within the outer conductor. The diameter of the inner conductor transitions from a diameter equal to the diameter of the inner conductor of the coaxial line at the coaxial end to a different diameter at the waveguide end. The inner conductor terminates adjacent the waveguide end substantially where the diameter of the convertor transitions to the coaxial waveguide diameter.

The convertor further comprises means for supporting the inner conductor at a concentric position within the outer conductor. In a preferred form, the supporting means comprises a dielectric support disposed between the inner and outer conductors.

To maximize the bandwidth of the convertor, the ratio of the outer conductor diameter to the inner conductor diameter at the waveguide end is selected so that the cutoff frequency of the TM$_{01}$ coaxial mode in the coaxial region of the convertor is at or above the cutoff frequency for the TM$_{02}$ circular waveguide mode.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 1 is a perspective view of a mode conversion device in accordance with the present invention.

FIG. 2 is a cross-sectional diagram of the mode conversion device of FIG. 1 taken along line 2—2 of FIG. 1.

FIG. 3 illustrates the electrical field pattern of the coaxial mode.

FIG. 4 illustrates the electric field pattern of the TM$_{01}$ mode.

FIGS. 5A and 5B are plots of the return loss and VSWR, respectively, of an exemplary convertor device embodying the invention, illustrating the match of the device.

DETAILED DESCRIPTION OF THE PREFERRED EMBODIMENT

Figure 5B:
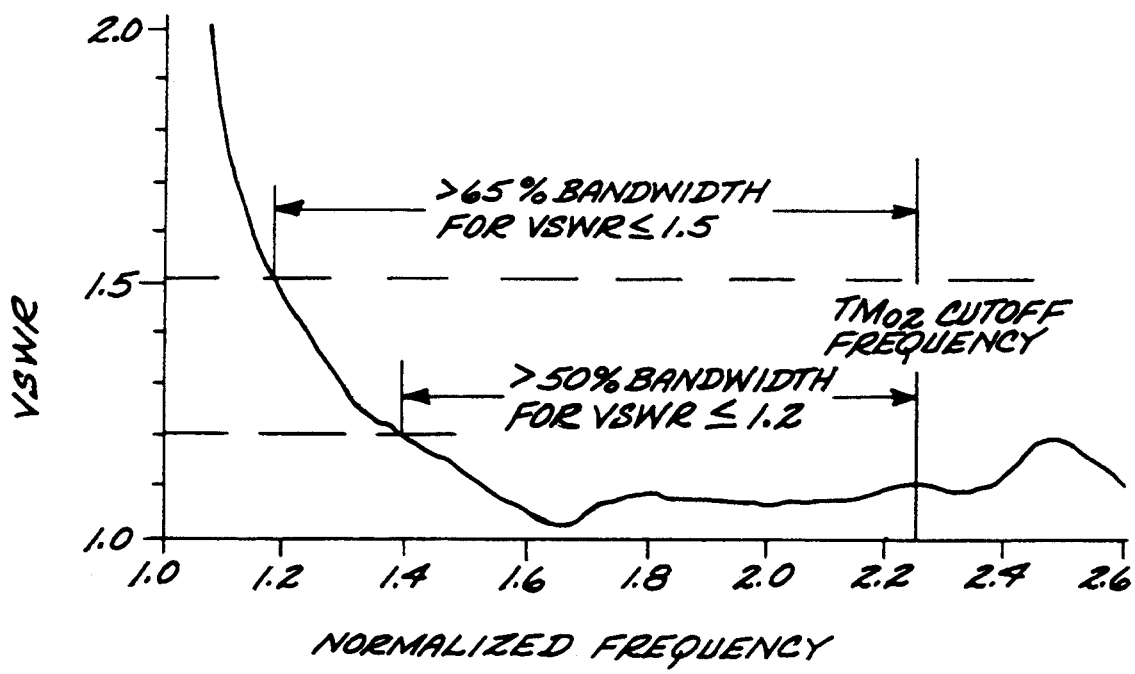

This invention is a modification of the first prior art approach which uses a small coaxial probe to excite the TM$_{01}$ mode in the circular waveguide. The invention recognizes the need to enlarge the diameters of both the inner and outer conductors of the coaxial line to provide a better electric field match from the toroidal opening of the coaxial line into the circular waveguide. This is accomplished by tapering the coaxial line from the normal dimensions (typically 0.276" outer diameter) up to where the outer diameter of the coaxial line matches the diameter of the circular waveguide, which is determined by the frequency range of operation. At that junction, the center conductor stops and the TM$_{01}$ mode is launched into the circular waveguide.

FIGS. 1–2 show a mode convertor 50 embodying the present invention. The convertor comprises an essentially conically shaped outer conductor member 52 which transitions over a length L1 from a diameter D1 equal to the diameter of a coaxial connector 70 fitted at the coaxial end of the convertor 50, to the diameter D2 of the cylindrical waveguide 56 to which the device 50 is to be connected. The waveguide end of the convertor device 50 is terminated in a waveguide flange 54 for physical connection to the cylindrical waveguide 56. Thus, the outer conductor of convertor 50 tapers from the waveguide diameter at the waveguide end to the diameter of the outer conductor of the coaxial connector 70.

The convertor 50 further comprises a tapered center conductor element 60. The diameter of the center conductor 60 transitions from the diameter of the coaxial center conductor to a much larger diameter at the point at which the conical outer conductor 52 transitions to the cylindrical region 56. The center conductor is supported in a concentric position within the outer conductor 52 by dielectric supports 62 and 64. Conventional techniques commonly used in transmission line design are incorporated in the dimensions of the dielectric supports to minimize the effect of the supports on the wave propagation and are not discussed further here. The diameter of the center conductor 60 in relation to the diameter of the adjacent portion of the outer conductor 52 is in general selected to taper the smaller diameter, set for 50 ohms at the connector in this exemplary embodiment, up to the larger diameter at the circular waveguide end.

The length L1 over which the taper of the inner and outer conductors 52 and 60 takes place can be tailored to the particular application. In general, the goodness of the match between the coaxial mode and the waveguide mode improves with increasing L1. This is because the more gradual the transition to the waveguide, the more gradual the discontinuity at 66, and higher order modes are excited with less amplitude at this transition. However, the particular taper angle and corresponding length L1 can be designed in accordance with the requirements for particular applications.

The convertor 50 exploits the somewhat similar electric field configurations of the coaxial mode and the $TM_{01}$ field pattern of the cylindrical waveguide mode. The fields are illustrated in FIGS. 3 and 4. FIG. 3 shows a cross-section of a coaxial transmission line 80 comprising a cylindrical outer conductor 82 and a concentric center conductor 84, with the radially directed field lines extending between the center conductor and the outer conductor. FIG. 4 shows a cylindrical waveguide, with the radially extending electric field lines of the $TM_{01}$ mode electric field pattern. It can be seen that the electric field patterns of the coaxial line mode and the $TM_{01}$ cylindrical waveguide mode are somewhat similar.

Figure 7:
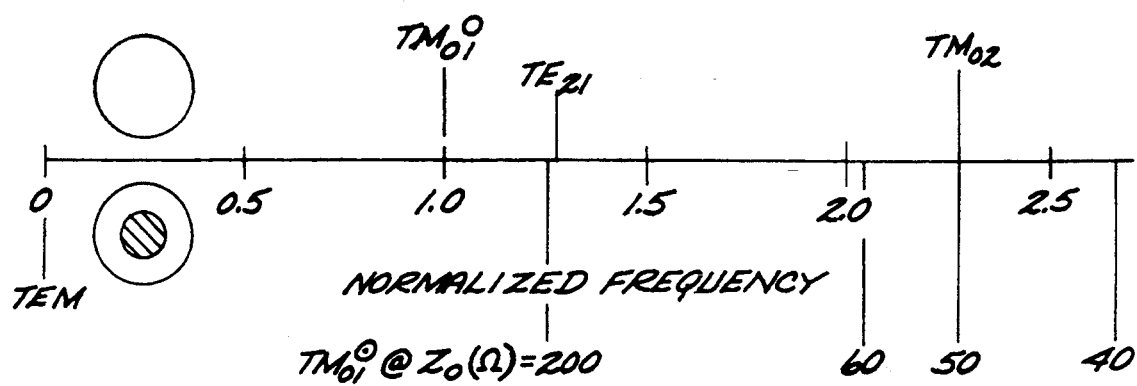
FIG. 7 is a mode chart showing the relationship between different circular and coaxial waveguide modes, with frequency normalized to the TM$_{01}$ circular waveguide mode cutoff frequency.

One important design parameter for this convertor is the ratio of the outer and inner conductors at the junction with the circular waveguide. For this embodiment, the ratio is set at the connector 70 to be 2.3, determined by the requirement for the characteristic impedance to be 50 ohms. Tapering to other values at the circular waveguide junction was considered in light of the bandwidth and matching performance. The operating bandwidth of the circular waveguide mode is limited on the low frequency end by the $TM_{01}$ cutoff frequency and on the high side by the $TM_{02}$ cutoff frequency, both of which are fixed by the waveguide diameter. This range represents the maximum possible and is shown in the mode chart of FIG. 7. The operational bandwidth of the coaxial region starts at zero frequency (TEM mode cutoff) and extends to the cutoff frequency of the $TM_{01}$-coax mode. This $TM_{01}$-coax mode is different from the $TM_{01}$ in the circular waveguide and has a cutoff frequency which is strongly a function of the characteristic impedance $Z_o$. FIG. 7 shows the $TM_{01}$-coax cutoff frequency for four impedance levels 40, 50, 60 and 200 ohms. If an impedance level of 200 ohms were selected, the cutoff frequency is only 1.25 that of the $TM_{01}$ circular mode and results in about 10% operating band. This value is representative of the example in the first prior art discussed. If, however, an impedance value of fifty (50) ohms or lower is selected, the cutoff frequency is pushed equal to or higher than that for the $TM_{02}$ circular mode. Therefore, the coaxial modes can be made to not be the limiting aspect of the convertor.

Since a value of 50 ohms does not limit the bandwidth and also is the value at the connector end of the taper, it was the value selected for the center conductor in this exemplary embodiment, thereby setting the diameter ratio to 2.3 at the large end as well.

Using a ratio of 2.3 and the other constraints on bandwidth establishes a design which minimizes the electric field at the coax/circular waveguide junction, therefore establishing a maximum power handling design for a given size circular waveguide.

It is to be understood that the value of 50 ohms as the characteristic impedance is by way of example only, and that other values for the characteristic impedance may be selected for particular applications. It should further be recognized that the characteristic impedance of the convertor need not be constant over its length. For example, the mode convertor may be employed as a transition between a 50 ohm coaxial line and a launching coaxial impedance at 66 which is other than 50 ohms. In a general sense then, the mode convertor of this invention may be employed to transition between the characteristic impedance of a coaxial line and an arbitrary launching characteristic impedance at 66. However, the widest bandwidth for the convertor will be obtained when a constant characteristic impedance is employed over the extent of the mode convertor.

The excellent matching of the electric field patterns at the junction between the two different modes results in broadband operation with very little reflection. This convertor is easily scaled to any frequency band. FIGS. 5A and 5B shows these results, measured in Ku-Band test fixtures and are representative of all bands. The frequency scale has been normalized to the cylindrical waveguide $TM_{01}$ mode cutoff frequency so that the data applies to any band.

Figure 6:
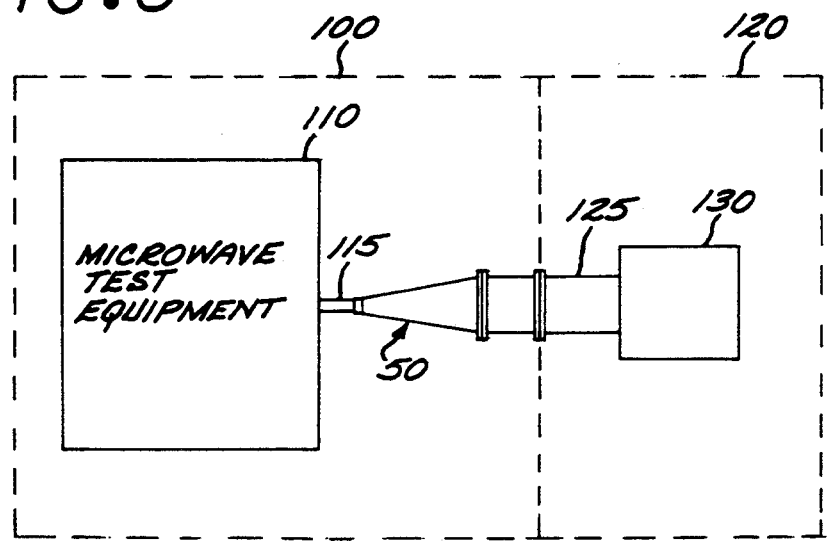
FIG. 6 is a schematic block diagram of a microwave test apparatus employing a mode convertor in accordance with the invention.

FIG. 6 illustrates an exemplary microwave test system 100 embodying a mode convertor 50 in accordance with this invention. This system is to be used to conduct microwave testing of a test unit 120 which includes a circular waveguide transmission line 125. The testing requires that a circular waveguide $TM_{01}$ mode be excited in the waveguide 125. The test system includes microwave test equipment 110 with a coaxial transmission line 115. In order to provide the capability of exciting the circular waveguide mode from the coaxial line 115, the test system 100 further includes a coaxial-to-$TM_{01}$ mode convertor 50, connected between the coaxial line 115 and the circular waveguide 125, in turn connected to the microwave unit 130 under test. Unit 130 is any component for which its characterization with respect to the $TM_{01}$ circular waveguide mode is being tested.

The advantages of a mode convertor in accordance with this invention include (i) that it is well matched over a broad band(<1.5:1 VSWR for >65% or <1.2:1 VSWR for >50% band). Previous approaches have been narrow band. More-over, the convertor maintains mode purity over the whole TM01 band, up to where the $TM_{02}$ mode begins. A further advantage is that the convertor is relatively small and simple to fabricate. The convertor provides a design and test instrumentation capability for components which use the circular waveguide $TM_{01}$ mode, and could be incorporated into microwave components which require this type of mode conversion.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A wideband coaxial-to-circular waveguide mode convertor for connection between a coaxial transmission line and a circular waveguide, and is characterized by a coaxial end and a waveguide end, comprising:
   a hollow outer conductor, having a diameter equal to the diameter of the outer conductor of said coaxial line at said coaxial end and a diameter at said circular waveguide end equal to the diameter of said circular waveguide at said circular waveguide end;
   an inner conductor concentrically mounted within said outer conductor, said inner conductor having a diameter equal to the diameter of the inner conductor of said coaxial line at said coaxial end and a diameter at said waveguide end;
   said inner conductor terminating adjacent said waveguide end to provide a means for launching $TM_{01}$ mode energy into said circular waveguide; and
   means for supporting said inner conductor at a concentric position within said outer conductor;
   wherein said convertor creates a conversion between the coaxial (TEM) mode and the $TM_{01}$ circular waveguide mode.

2. The coaxial-to-waveguide convertor of claim 1 wherein said supporting means comprises a dielectric support disposed between said inner and outer conductors.

3. The convertor of claim 1 wherein the ratio of said outer conductor diameter to said inner conductor diameter at said waveguide end is of a value so that the cutoff frequency of the $TM_{01}$ coaxial mode in the coaxial region of said convertor is at or above the cutoff frequency for the $TM_{02}$ circular waveguide mode.

4. The convertor of claim 1 wherein the diameter of said inner conductor provides a substantially constant characteristic impedance along the extent of said convertor.

5. The convertor of claim 4 wherein said substantially constant characteristic impedance is equal to the characteristic impedance of said coaxial transmission line.

6. The convertor of claim 1 wherein said coaxial transmission line has a nominal characteristic impedance of 50 ohms, and said ratio of said outer conductor diameter to said inner conductor diameter is nominally 2.3.

7. The convertor of claim 1 wherein said waveguide end is terminated in a waveguide flange for connection to said circular waveguide.

8. The convertor of claim 7 wherein said coaxial end is terminated in a coaxial connector.

9. The convertor of claim 1 wherein said outer conductor in tapered from said coaxial end to said circular waveguide end, and said inner conductor is tapered from said coaxial end to said waveguide end.

10. A microwave testing system for performing tests of a microwave unit comprising a cylindrical waveguide, comprising:
    microwave test equipment;
    a coaxial transmission line connected to said microwave test equipment; and
    a wideband coaxial-to-circular waveguide mode convertor for connection between said coaxial transmission line and cylindrical waveguide of said microwave unit, said mode convertor comprising:
      a hollow outer conductor, said outer conductor having a diameter equal to the diameter of the outer conductor of said coaxial line at a coaxial end of said convertor and a diameter equal to that of said circular waveguide at a circular waveguide end of said convertor;
      an inner conductor concentrically mounted within said outer conductor, the diameter of said inner conductor having a diameter equal to the diameter of the inner conductor of said coaxial line at said coaxial end and a diameter at said waveguide end;
      said inner conductor terminating adjacent said waveguide end to provide a means for launching $TM_{01}$ energy into the circular waveguide; and
      means for supporting said inner conductor at a concentric position within said outer conductor;
      wherein said convertor creates a conversion between the coaxial (TEM) mode and the $TM_{01}$ circular waveguide mode.

11. The system of claim 10 wherein said supporting means comprises a dielectric support disposed between said inner and outer conductors.

12. The system of claim 10 wherein the ratio of said outer conductor diameter to said inner conductor diameter at said waveguide end is of a value so that the cutoff frequency of the $TM_{01}$ coaxial mode in the coaxial region of said convertor is at or above the cutoff frequency for the $TM_{02}$ circular waveguide mode.

13. The system of claim 10 wherein the diameter of said inner conductor provides a substantially constant characteristic impedance along the extent of said convertor.

14. The system of claim 13 wherein said substantially constant characteristic impedance is equal to the characteristic impedance of said coaxial transmission line.

15. The system of claim 10 wherein said coaxial transmission line has a nominal characteristic impedance of 50 ohms, and said ratio of said outer conductor diameter to said inner conductor diameter is nominally 2.3.

16. The system of claim 10 wherein said waveguide end is terminated in a waveguide flange for connection to said circular waveguide.

17. The system of claim 16 wherein said coaxial end is terminated in a coaxial connector.

18. The convertor of claim 10 wherein said outer conductor in tapered from said coaxial end to said circular waveguide end, and said inner conductor is tapered from said coaxial end to said waveguide end.

19. A wideband coaxial-to-circular waveguide mode convertor for conversion between the coaxial (TEM) mode and the $TM_{01}$ circular waveguide mode, for connection between a coaxial transmission line and a circular waveguide, and which is characterized by a coaxial end and a waveguide end, comprising:
- a tapered, hollow outer conductor, the diameter of said outer conductor transitioning from a diameter equal to the diameter of the outer conductor of said coaxial line at said coaxial end to the diameter of said circular waveguide at said circular waveguide end;
- a tapered inner conductor concentrically mounted within said outer conductor, the diameter of said inner conductor transitioning from a diameter equal to the diameter of the inner conductor of said coaxial line at said coaxial end to a different diameter at said waveguide end;
- wherein the ratio of said outer conductor diameter to said inner conductor diameter at said waveguide end is of a value so that the cutoff frequency of the $TM_{01}$ coaxial mode in the coaxial region of said convertor is at or above the cutoff frequency for the $TM_{02}$ circular waveguide mode;
- said inner conductor terminating adjacent said waveguide end to provide a means for launching $TM_{01}$ waveguide mode energy into the circular waveguide; and
- means for supporting said inner conductor at a concentric position within said outer conductor;
- wherein said converter creates a conversion between the coaxial (TEM) mode and the $TM_{01}$ circular waveguide mode.

20. The convertor of claim 19 wherein said supporting means comprises a dielectric support disposed between said inner and outer conductors.

21. The convertor of claim 19 wherein the diameter of said inner conductor provides a substantially constant characteristic impedance along the extent of the tapered portion of said convertor.

22. The convertor of claim 21 wherein said substantially constant characteristic impedance is equal to the characteristic impedance of said coaxial transmission line.

23. The convertor of claim 19 wherein said coaxial transmission line has a nominal characteristic impedance of 50 ohms, and said ratio of said outer conductor diameter to said inner conductor diameter is nominally 2.3.

24. The convertor of claim 19 wherein said waveguide end is terminated in a waveguide flange for connection to said circular waveguide.

25. The convertor of claim 24 wherein said coaxial end is terminated in a coaxial connector.

* * * * *